United States Patent
Capecchi et al.

(10) Patent No.: US 11,189,343 B2
(45) Date of Patent: Nov. 30, 2021

(54) CURRENT-GENERATOR CIRCUIT

(71) Applicant: STMicroelectronics S.r.l., Agrate Brianza (IT)

(72) Inventors: Laura Capecchi, Vedano al Lambro (IT); Marco Pasotti, Travaco' Siccomario (IT); Marcella Carissimi, Treviolo (IT); Riccardo Zurla, Binasco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/940,837

(22) Filed: Jul. 28, 2020

(65) Prior Publication Data

US 2021/0035637 A1 Feb. 4, 2021

(30) Foreign Application Priority Data

Aug. 1, 2019 (IT) .................. 102019000013695

(51) Int. Cl.
*G11C 5/14* (2006.01)
*G11C 13/00* (2006.01)
*G05F 3/26* (2006.01)

(52) U.S. Cl.
CPC .......... *G11C 13/0038* (2013.01); *G05F 3/262* (2013.01); *G11C 13/003* (2013.01); *G11C 13/0004* (2013.01); *G11C 13/0026* (2013.01); *G11C 13/0069* (2013.01)

(58) Field of Classification Search
CPC ............ G11C 13/0038; G11C 13/0004; G11C 13/0026; G11C 13/003
USPC .................................................... 365/189.09
See application file for complete search history.

(56) References Cited

U.S. PATENT DOCUMENTS

| | | | |
|---|---|---|---|
| 9,728,231 B1 * | 8/2017 | Lee .................. | G11C 5/147 |
| 2008/0298122 A1 | 12/2008 | Bedeschi et al. | |
| 2009/0091969 A1 | 4/2009 | Ueda | |
| 2013/0229863 A1 * | 9/2013 | Conte ................ | G11C 13/0038 365/163 |
| 2018/0061499 A1 * | 3/2018 | Disegni ............. | G11C 16/24 |

* cited by examiner

*Primary Examiner* — Vu A Le
(74) *Attorney, Agent, or Firm* — Slater Matsil, LLP (57) ABSTRACT

A current-generator circuit includes an output-current generator circuit having a control branch to be coupled to a control current generator and adapted to provide a control current pulse and a driver electrically coupled between the control branch and the output leg. A compensation circuit includes a first compensation branch configured to generate a compensation current pulse that is a function of the control current pulse and a second compensation branch coupled in a current mirror configuration with the first compensation branch to receive the compensation current pulse. The second compensation branch includes a resistive block having an electrical resistance that is a function of a resistance of an output load. The second compensation branch is electrically coupled to the control branch and the driver is electrically coupled to the control branch and to the output leg.

21 Claims, 6 Drawing Sheets

CURRENT-GENERATOR CIRCUIT

CROSS-REFERENCE TO RELATED APPLICATIONS

This application claims priority to Italian Patent Application No. 102019000013695, filed on Aug. 1, 2019, which application is hereby incorporated herein by reference.

TECHNICAL FIELD

The present invention relates generally to a current-generator circuit, a device including the current-generator circuit and an electronic system.

BACKGROUND

Phase change non-volatile memories (also known as PCMs—"Phase Change Memories") are known in the art. To store information, the characteristics of materials that have the property of switching between phases having different electrical characteristics are exploited. For example, such materials can switch between an amorphous, disordered phase and an ordered crystalline or polycrystalline phase; the two phases are associated with resistivities of a considerably different value, and consequently to a different value of a stored data.

For example, the elements of the VI group of the periodic table, such as Tellurium (Te), Selenium (Se), or Antimony (Sb), called chalcogenides or chalcogenic materials, can be used advantageously for the realization of phase change memory cells. The phase changes are obtained by locally increasing the temperature of the chalcogenic material, through resistive electrodes (generally known as heaters) arranged in contact with respective regions of chalcogenic material.

Selection devices (for example MOSFET transistors) are connected to the heaters, and enable the passage of an electrical programming current through a respective heater (electrical pulses known as "SET" and "RESET", adapted to set a respective phase of the material); the electric current generates, through Joule effect, the temperature increase required for the phase change. During reading operations, the state of the chalcogenic material is detected by applying a sufficiently low voltage across the selected cell, so as not to cause a significant heating, and then by reading the value of the current flowing in the cell. Since the current is proportional to the conductivity of the chalcogenic material, it is possible to determine the state of the material, and therefore the data stored in the memory cell.

In a known way, non-volatile memories comprise a matrix of memory cells organized in rows (word lines) and columns (bit lines); each memory cell is made, in the case of PCM memories, of a phase-change storage element and a selector transistor connected in series. A column decoder and a row decoder allow to select, on the basis of received input logic signals and a decoding scheme, the addressed memory cells, and in particular the respective word lines and bit lines.

The column decoder comprises a plurality of analog selection switches (implemented by transistors), receiving the address signals at the respective control terminals; the selection switches are organized according to a tree structure in hierarchical levels, and their number in each hierarchical level is linked to the organization and size of the memory matrix. The selection switches, when enabled, allow the selected bit line to be biased at a defined voltage and/or current value, depending on the operations to be implemented; in particular, a current path is created between a programming stage or a reading stage and the selected bit line. This current path is defined by the series of a certain number of selection switches.

In a known way, reading amplifiers ("sense amplifiers") read the data stored in the memory cells by comparing the current (or an electrical quantity correlated to it) that flows into the selected memory cell (also called "direct cell") with a reference current flowing in a complementary cell (so-called "double-ended" reading). Obviously, also the programming step must provide for the writing of the logical data both in the direct memory cell and in the complementary cell. For example, the bit written in the complementary cell (e.g., logic "i") is associated with a RESET state (by means of a RESET impulse), while the same bit ("1") is written in the direct cell by means of a SET impulse.

Figure 1:
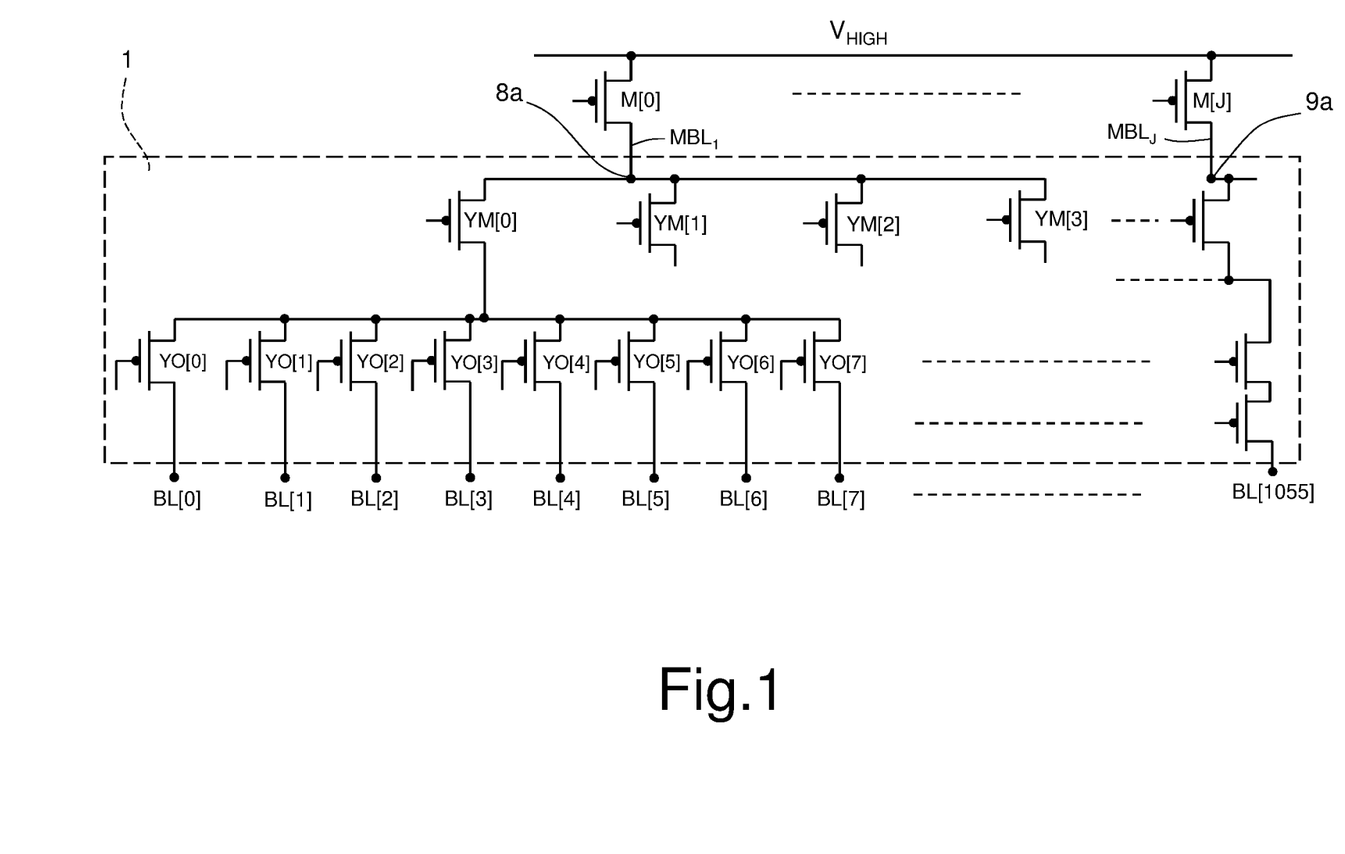
FIG. 1 is a circuit representation of a portion of a known phase-change memory device including a column decoder.

FIG. 1 shows a circuit typically used to implement the column decoder 1. Any local bitline BL is selected only when the corresponding path to $V_{HIGH}$ is enabled. The first addressing level is formed by PMOS transistors YM (here, 4 transistors YM[0] to YM[3]) which are connected to the drain terminal of transistors M (here, a number "J" of transistors M[0], ..., M[J]—e.g. J=32). Moreover, PMOS transistors YO (i.e., one transistor for each bit line BL) implement a second addressing level. In order to guarantee that the programming current generated by transistors M is fed correctly into the selected PCM cell, only one of the four YM transistors, connected to its drain terminal, as well as only one of the transistors YO that are connected to the active transistor YM is turned on at a given time. Furthermore, each transistor M can program one cell belonging to any of the associated bit lines BL. The row decoder selects the addressed cell by raising the corresponding word line WL to a bias voltage generated by a row voltage regulator.

Figure 2:
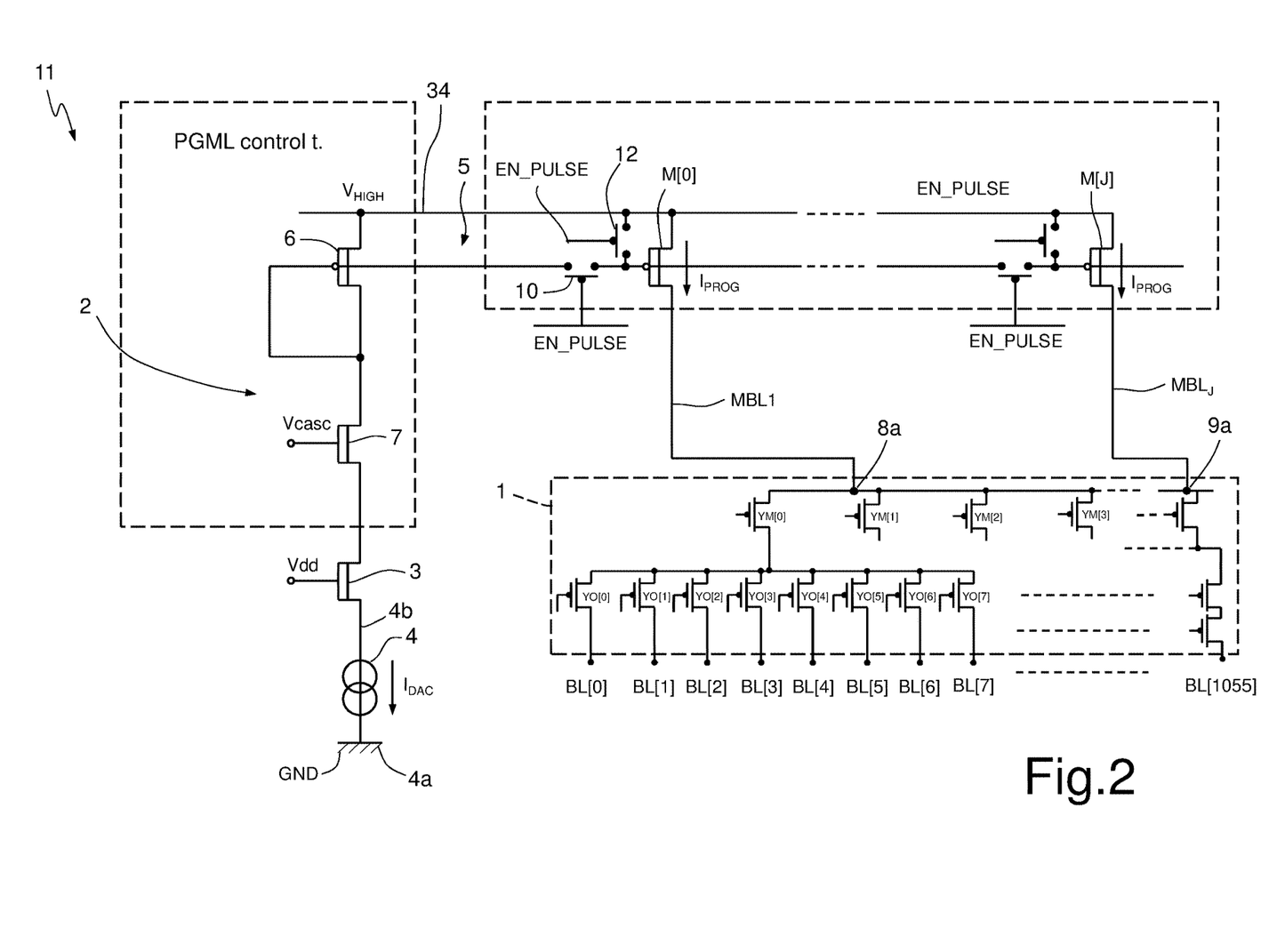
FIG. 2 is a circuit representation of a programming circuit for writing logic data in a phase-change memory cell, according to the known art.

FIG. 2 shows a circuit 11 for generating a programming current for programming PCM memory cells, according to the known art.

Circuit 11 comprises a control branch 2, including: a current generator 4, configured to cooperate to the generation of a RESET or SET pulse, depending on the operating condition, connected between a reference terminal 4a (ground, GND) and a biasing terminal 4b; and a control transistor 6 (here, a diode-connected P-type MOSFET), forming a first element of a current mirror 5.

The current generator 4 is, e.g., a Digital-to-analog-Converter, DAC, and is configured to generate a current pulse $I_{DAC}$ in the control branch 2.

The current generator 4 and the control transistor 6 are connected in series between the ground reference terminal 4a and a line 34 at $V_{HIGH}$ voltage, for example equal to 5 V. The control branch 2 further includes, between the current generator 4 and the transistor 6, in series to the current generator 4 and the control transistor 6, a switch 3, adapted to be switched on and off with the aim of connecting and, respectively disconnecting, the current generator 4 to, respectively from, the rest of the control branch 2 (in particular, to connect/disconnect the current generator 4 to/from the current mirror 5); the switch 28 is, e.g., a n-type MOFET device controlled by a Vdd signal generated by a control logic which is not part of the present invention. The Vdd signal has a value adapted to turn on the switch 3 when the memory is being programmed and to turn off the switch 3 otherwise, so that no undesired current can flow to the memory cells through the mirror 5. The switch 3 is optional, and may be omitted or designed in a different way.

The control branch 2 further comprises a cascode switch 7, e.g. an n-type MOSFET device, arranged in series to the switch 3, electrically arranged between the switch 3 and the mirror device 5. The cascode switch 7 has a control terminal (gate) controlled by a signal Vcasc, provided by a regulator of a known type. The cascode switch 7 has the function of improving the electrical isolation between the part of the control branch 2 which includes the current generator 4 (low voltage portion of the branch 2, where voltage is in the range 0.5-0.9 V) and the part of the control branch 2 that includes the current mirror 5 (high voltage portion of the control branch 2, at voltage $V_{HIGH}$), so that reverse transmission is reduced as there is no direct coupling between the two portions at different voltages.

During use, when the current generator 4 is controlled to generate current $I_{DAC}$ (SET or RESET pulse), the current $I_{DAC}$ flows through the control branch 2 between the line at $V_{HIGH}$ and the ground reference terminal GND, and is mirrored, through the current mirror 5, in respective programming currents $I_{PROG}$ of a plurality of main bitlines $MBL_1, \ldots, MBL_J$.

The current $I_{PROG}$ (SET/RESET pulse) flows through the respective main bitline $MBL_1, \ldots, MBL_J$, depending on the activation of transistors M (here, P-type MOSFETs). The transistors M are connected in a current-mirror configuration to the transistor 6. In particular, the activation of the transistors M is controlled by two respective switches which are turned on and off by enabling signals EN_PULSE, /EN_PULSE (wherein/EN_PULSE has a logic value complementary to that of EN_PULSE).

With reference to the main bitline $MBL_1$, a switch 10 (e.g., P-channel transistor) is coupled between the gate of the transistor M[0] and the gate of the control transistor 6 and a switch 12 (e.g., P-channel transistor) is coupled between the gate of the transistor M[0] and the $V_{HIGH}$ line. In this way, as apparent to the skilled person in the art, the current $I_{DAC}$ on the control branch 2 is mirrored in the main bitline $MBL_1$ only when switch 10 is turned on and, at the same time, switch 12 is turned off, i.e., only when the signals EN_PULSE and/EN_PULSE have a respective (complementary) value such as to bring the switch 10 in a conduction state and the switch 12 in interdiction.

The same configuration is then repeated for all the "J" main bitlines forming the memory device.

To sum up, the programming current $I_{PROG}$ (SET/RESET pulse) is supplied to each phase-change memory element which must be programmed by means of this current. It is apparent that the current pulses should be shaped and have an amplitude such as to induce the phase transition in the phase change memory elements to which they are applied. Moreover, it is known to the Applicant to apply current pulses to several memory elements in parallel, to speed up the writing operation.

The transistors M are affected by channel modulation due to the undesired variation of their drain-source voltage $V_{DS}$ due to an uncontrolled variation of the resistance on the main bitlines $MBL_1, \ldots, MBL_J$. This effect is due to the fact that the resistance of each PCM cell is not perfectly equal to the resistance of the other PCM cells, because of variations occurring during the manufacturing process and during use and, at the same time, the intensity of the programming pulses can vary unexpectedly from one cycle to another due to non-idealities.

In other words, the voltages at nodes 8a, 9a (terminals of driving transistors M[0], . . . , M[J]) of the main bitlines MBL1, . . . , MBLJ, depend unpredictably on the electrical resistance value of the phase change memory elements being programmed and on the amplitude of the current pulses applied to them.

The channel modulation effect has an impact on current pulse amplitude precision. This means that not all the programming pulses are equally effective and suitable to set the desired resistive state (SET or RESET) to the memory element to which they are applied.

The same problem can be found in other kind of circuits or applications, in particular where a current-generation circuit, using a current-mirror configuration, is employed to supply an output current to a resistive load.

SUMMARY

Embodiments of the present invention relate to a current-generator circuit (e.g., a programming circuit for writing data in a phase-change memory cell), to a phase-change memory device (e.g., a phase-change memory) including the current-generator circuit, and to a system including the device.

Embodiments of the present invention, relate to a current-generator circuit operable to generate an output current pulse to be fed to a resistive load. A current generator circuit includes a control branch coupled to a control current generator adapted to generate a control current pulse, and a driver, electrically coupled to the control branch and the resistive load. A compensation circuit comprises a first compensation branch configured to generate a first compensation current pulse which is a fraction of the control current pulse, a second compensation branch coupled in a current mirror configuration to the first compensation branch for receiving the first compensation current pulse. The second branch includes a resistive block having an electrical resistance that mimics the resistance of the resistive load. The second compensation branch is electrically coupled to the control branch to supply the control branch with the compensation current pulse in such a way that the compensation current pulse is added/subtracted to/from the control current pulse to generate a compensated current pulse. The driver is electrically coupled to the control branch and to the resistive load to receive from the control branch the compensated current pulse and to generate the output current pulse as a function of the compensated current pulse.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF ILLUSTRATIVE EMBODIMENTS

The present invention will be now described with specific reference to a programming circuit adapted for generating programming current pulses suitable for programming one or more memory cells of a phase-change type, without losing generality. In particular, as it will be apparent from FIG. 6 and related description, the present invention finds application as programming circuit for any kind of resistive memory (e.g., conductive bridge RAM—CBRAM, Oxide based RAM—OxRAM, etc.), as well as current generator for resistive heaters that are employed in high temperature gas sensors, for reconfigurable integrated antennas, for dispenser cathodes, for beam control in semiconductor laser, and for still other applications, devices and systems requiring a current generator which is insensitive to the effect of the resistive load.

Figure 3:
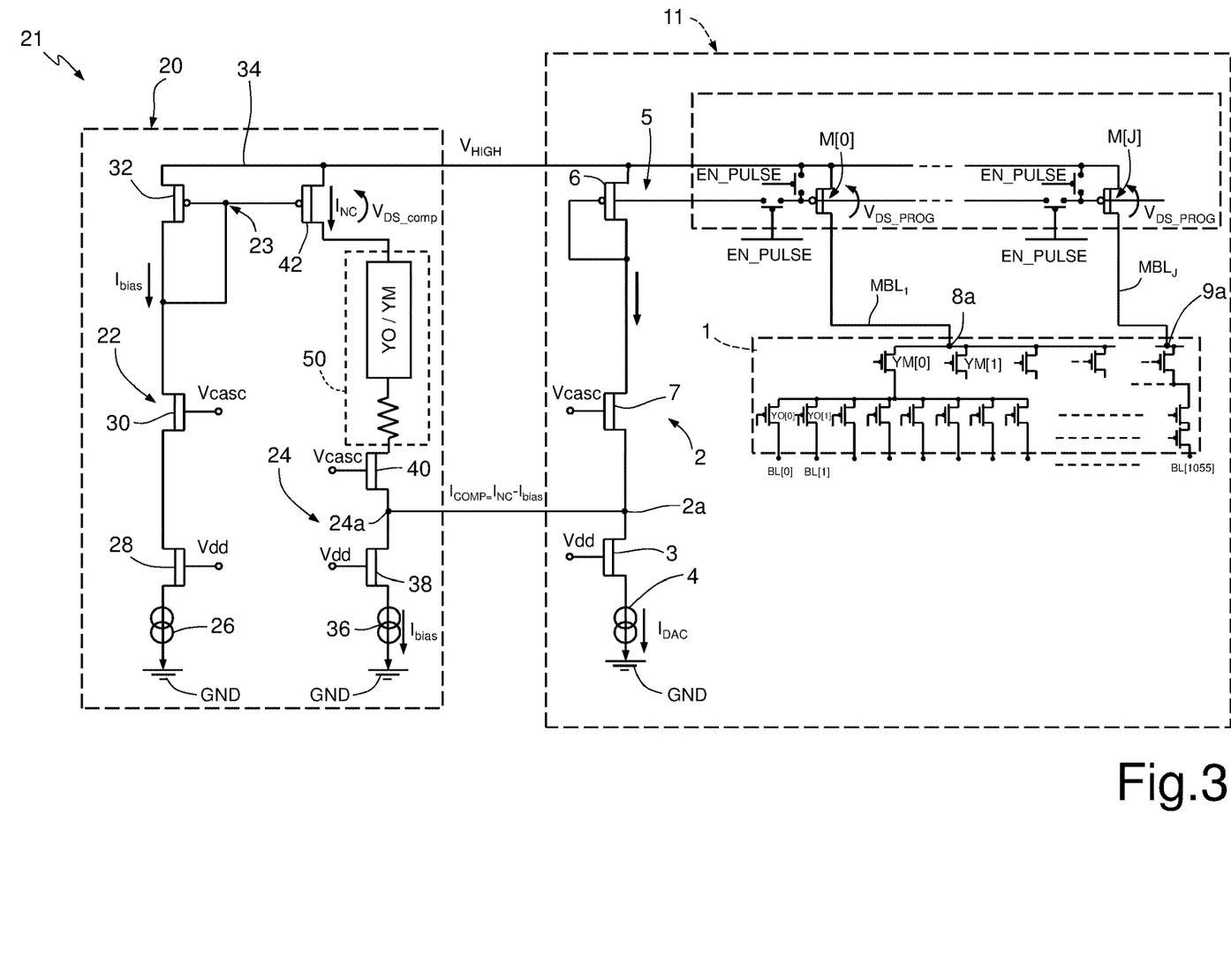
FIG. 3 is a circuit representation of a programming circuit for writing logic data in a phase-change memory cell, according to the present invention.

FIG. 3 shows a programming circuit 21 for generating programming current pulses suitable for programming one or more memory cells of a phase-change type. The programming circuit 21 includes a compensation circuit 20 operatively coupled to the circuit 11 of FIG. 2, with the aim of compensating or reducing the channel modulation effect discussed above.

The compensation circuit 20 includes a biasing branch 22 and a compensation branch 24; the biasing branch 22 extends between the high-voltage line 34 at voltage $V_{HIGH}$ (e.g., between 4 and 6 V) and the reference terminal GND at reference voltage (e.g., at 0 V). The biasing branch 22 is configured to generate a biasing current $I_{bias}$ and to mirror the biasing current $I_{bias}$ to the compensation branch 24 through a current mirror 23 (in particular, with unitary gain).

The compensation branch 24 analogously extends between the high-voltage line 34 and the reference terminal GND.

In greater detail, the biasing branch 22 comprises a current generator 26 (e.g., a digital-to-analog-converter or DAC to allow digital current control), configured to generate a current pulse in the biasing branch 22 having an amplitude that is a fraction of the amplitude of the current pulse $I_{DAC}$ generated by the control branch 2 of the circuit 11 of FIG. 2. Provided that the current pulse $I_{DAC}$ generated by the control branch 2 has an amplitude "A", the current pulse $I_{bias}$ generated by the DAC 26 has an amplitude "α·A", with α≤1 (preferably, α<1, more specifically 0.5<α<0.8).

The biasing branch 22 further includes a first control switch 28, adapted to be switched on and off with the aim of connecting and, respectively disconnecting, the DAC 26 to, respectively from, the rest of the biasing branch 22 (in particular, connect/disconnect the DAC 26 to/from the current mirror 23); the first control switch 28 is, e.g., a n-type MOFET device controlled by the Vdd signal, as discussed with reference to FIG. 2. The Vdd signal has a value adapted to turn on the first control switch 28 when the memory is being programmed and to turn off the first control switch 28 when no programming operation is required. The first control switch 28 is optional, and may be omitted.

The biasing branch 22 further comprises a cascode switch 30, e.g., a n-type MOSFET device, arranged in series to the first control switch 28, electrically between the DAC 26 and the high-voltage line 34 (in particular, between the first control switch 28, when present, and the high-voltage line 34). The cascode switch 30 has a control terminal (gate) controlled by the signal $V_c$, provided by the regulator as already discussed with reference to FIG. 2. The cascode switch 30 has the function of improving the electrical isolation between the part of the biasing branch 22 which includes the DAC 26 (low voltage portion of the biasing branch 22, where voltage is in the range 0.5-0.9 V) and the part of the biasing branch 22 that includes the current mirror 23 (high voltage portion of the biasing branch 22, at voltage $V_{HIGH}$ in the range 4-6V), so that reverse transmission is reduced as there is no direct coupling between the two portions at different voltages.

The current mirror 23 is formed in part by a mirror device 32 (here, a p-type MOSFET) arranged in the biasing branch 22 in series to the cascode switch 30, more specifically between the cascode switch 30 and the high-voltage line 34. The mirror device 32 is diode-connected, i.e. its control terminal (gate) is electrically connected to its drain terminal. During use, when the DAC 26 is controlled to generate current $I_{bias}$, the current $I_{bias}$ flows through the biasing branch 22 and is mirrored to the compensation branch 24.

As a circuit, the compensation branch 24 substantially replicates the biasing branch 22, as it comprises a current generator 36, a second control switch 38 and a cascode switch 40. The current generator 36 (e.g., a digital-to-analog-converter, or DAC, to allow digital current control), is configured to generate a current pulse in the compensation branch 24 having an amplitude equal to that of the current pulse generated by the current generator 26 in the biasing branch 22 ($I_{bias}$=α·A, with α<1).

The second control switch 38 (e.g., an n-type MOFET) is adapted to be switched on and off with the aim of connecting and respectively disconnect the DAC 36 to and from, respectively, the rest of the compensation branch 24. The second control switch 38 is controlled by the Vdd signal generated by the control logic. The second control switch 38 is optional and may be omitted.

The cascode switch 40 (e.g., a n-type MOSFET device) is electrically coupled in series to the DAC 36, between the DAC 36 and the high-voltage line 34 (for example, arranged in series to the second control switch 38, electrically coupled between the second control switch 38 and the high-voltage line 34). The cascode switch 40 has a control terminal (gate) controlled by the signal Vcasc.

The current mirror 23 is moreover formed in part by a second mirror device 42 (here, a p-type MOSFET), which is arranged in the compensation branch 24 in series to the cascode switch 40, more specifically between the cascode switch 40 and the high-voltage biasing line 34 at voltage $V_{HIGH}$. The second mirror device 42 has a control terminal (gate) connected to the control terminal (gate) of the mirror device 32, thus forming the current mirror 23.

According to an aspect of the present invention, the compensation branch 24 further comprises a resistive block 50 that mimics (in an embodiment, is equal to) the equivalent electrical resistance at node 8a, 9a of each main bitline $MBL_1, \ldots, MBL_J$ during a programming step (i.e., during logic data writing in the phase-change element). The main source of electrical resistance is given by the series of the electrical resistance(s) of the selector device(s) of the column decoder 1 and the electrical resistance of the phase-change element of the memory cell to be addressed (i.e., to be programmed).

When, for example, transistor M[0] is activated to propagate a current pulse $I_{prog}$ (SET or RESET pulse) on the main bitline $MBL_1$, the main sources of electrical resistance in the electrical path between terminal 8a of transistor M[0] and the cell to be programmed is given by the series resistance of the PCM memory cell itself and any resistance introduced by selector device(s) on that path. In the disclosed embodiment, the selector devices include, in particular, the transistor YM and the transistor YO which are activated (turned on) to address the PCM memory cell to be programmed, i.e. activated to connect the local bitline BL (to which the PCM memory cell to be programmed is coupled) to the main bitline $MBL_1$. Further selector devices, not shown in the present embodiment, may be coupled to the main bitline $MBL_1$ and/or to the local bitline BL, according to the specific design of the memory considered.

An analogous electrical resistance is seen at the terminal 9a of transistor M[J] during the programming step of a PCM memory cell coupled to the transistor M[J] through selector devices YM and YO of the column decoder 1.

In order to reproduce/mimic the above-identified series resistance, the resistive block 50 is designed in such a way to have an electrical resistance which is given by the sum of the electrical resistance of the phase-change memory cell during the programming step, plus any resistance introduced by the one or more selector YM, YO devices present on the path between the driving transistor and the phase-change memory cell being programmed (programming path). In the disclosed embodiment, the resistance $R_{COMP}$ of the block 50 is $R_{COMP}=R_{PCM}+R_{YO}+R_{YM}$.

The electrical resistance $R_{PCM}$ is that of the phase-change material of the memory cell at its melting point. Resistances $R_{YO}$ and $R_{YM}$ are the resistances of the transistors YO, respectively, YM when activated (i.e., during conduction).

Since the electrical resistance $R_{PCM}$ of the phase-change memory cell is higher than the resistances $R_{YO}$ and $R_{YM}$ of the transistors YO, YM, in an embodiment of the present invention the resistances $R_{YO}$, $R_{YM}$ of transistors YO, YM is omitted, so that the resistance of the resistive block 50 is approximated by the resistance $R_{PCM}$ of the memory cell during the programming step $R_{COMP}=R_{PCM}$ (that, in case of PCM, is the resistance of the phase-change material of the memory cell at its melting point).

A node 24a is identified in the compensation branch 24 between the cascode switch 40 and the DAC 36, more precisely between the cascode switch 40 and the second control switch 38. Analogously, a node 2a is identified in the control branch 2 of circuit 11 between the cascode switch 7 and the current generator 4, more precisely between the cascode switch 7 and the switch 3.

It is noted that current generator 36 sinks the current bias from branch 22 through the mirror 23, however, due to the channel modulation effect of transistor 42 caused by the difference between the drain-to-source voltages of transistor 42 and transistor 32, a current $I_{NC} \neq I_{bias}$ flows through transistor 42.

The node 24a is electrically connected (in particular, short-circuited) to the node 2a, so that a current $I_{COMP}=I_{NC}-I_{bias}$ is supplied from the compensation branch 24 to the control branch 2. Current $I_{COMP}$ may either be a positive current that is summed to the current $I_{DAC}$ generated by the current generator 4, or a negative current that is subtracted from the current $I_{DAC}$. Accordingly, a current $I_{CTR}$ flowing in the control branch 2 is given by $I_{DAC}-I_{COMP}$; the current $I_{CTR}$ is mirrored through the current mirror 5 in the program current $I_{prog}$. If the resistive block 50 is designed as identified above, then a voltage drop $V_{DS\_COMP}$ on the second mirror device 43 (substantially) equals a voltage drop $V_{DS\_PROG}$ on transistor M[0] (analogously, on transistor M[J]), and $I_{prog} \approx I_{DAC}$. Typically, the current mirror 5 is designed with a gain G (e.g., G=10), so that $I_{prog} \approx G \cdot I_{DAC}$.

According to the above, the programming current $I_{prog}$ is no more dependent (or minimally dependent) from the resistance of the phase-change material of the memory cell being programmed, since the modulation effect on the drain-source voltage of transistors M is balanced by the compensation current $I_{COMP}$.

Figure 4:
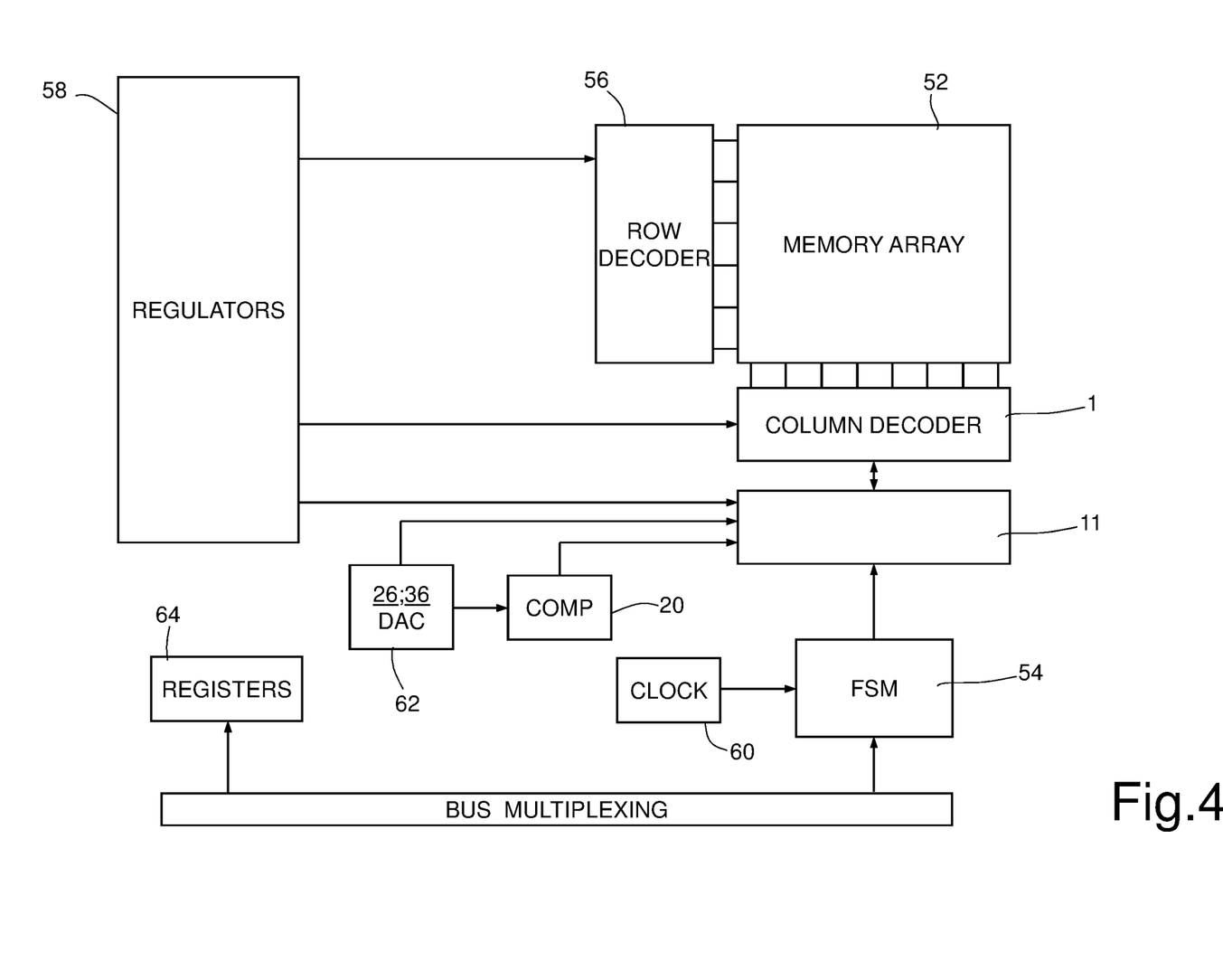
FIG. 4 is a simplified block diagram of a PCM device including the programming circuit of FIG. 3.

The schematic block of FIG. 4 shows a memory system 50 comprising the circuits 11 and 20 previously disclosed, and includes a PCM memory array 52, a finite state machine (FSM) 54, two decoders (namely, the row decoder 56 and the column decoder 1), voltage regulators 58, an internal oscillator 60, a digital-to-analog converter (DAC) 62, and several internal registers 64.

The majority of the area of the memory system 50 is occupied by the PCM memory array 52, which contains for example 557568 memory cells divided in 528 rows (WLs) and 1056 column (BLs). Data are stored in the memory using a differential approach and, therefore, cells are split into two categories: Direct Cells (DCs) and Complementary Cells (CCs). When a program operation is issued in order to store a given data, the information is written as it was received into DCs, but is also complemented and, then, written into the corresponding CCs. In this way, each data present in the memory has a complementary counterpart. The FSM 54 controls the internal operations of the memory system 50 (e.g., boot, write, read, etc.), and manages data reception and transmission through, e.g., a 32 bit Advanced High-performance Bus (AHB), which exploits an AMBA (Advanced Microcontroller Bus Architecture) protocol. This protocol is open source and is commonly used to carry out the communications inside a SoC, and is not part of the present invention. A clock is provided to the FSM 54 by the internal oscillator 60 that is designed to work at 1 MHz and is trimmed during the EWS phase to adjust its frequency in order to attenuate the effect of process spreads. Furthermore, during boot operation, the FSM 54 loads the trimming configurations and the pulse settings from the memory reserved sector to the registers.

Figure 5:
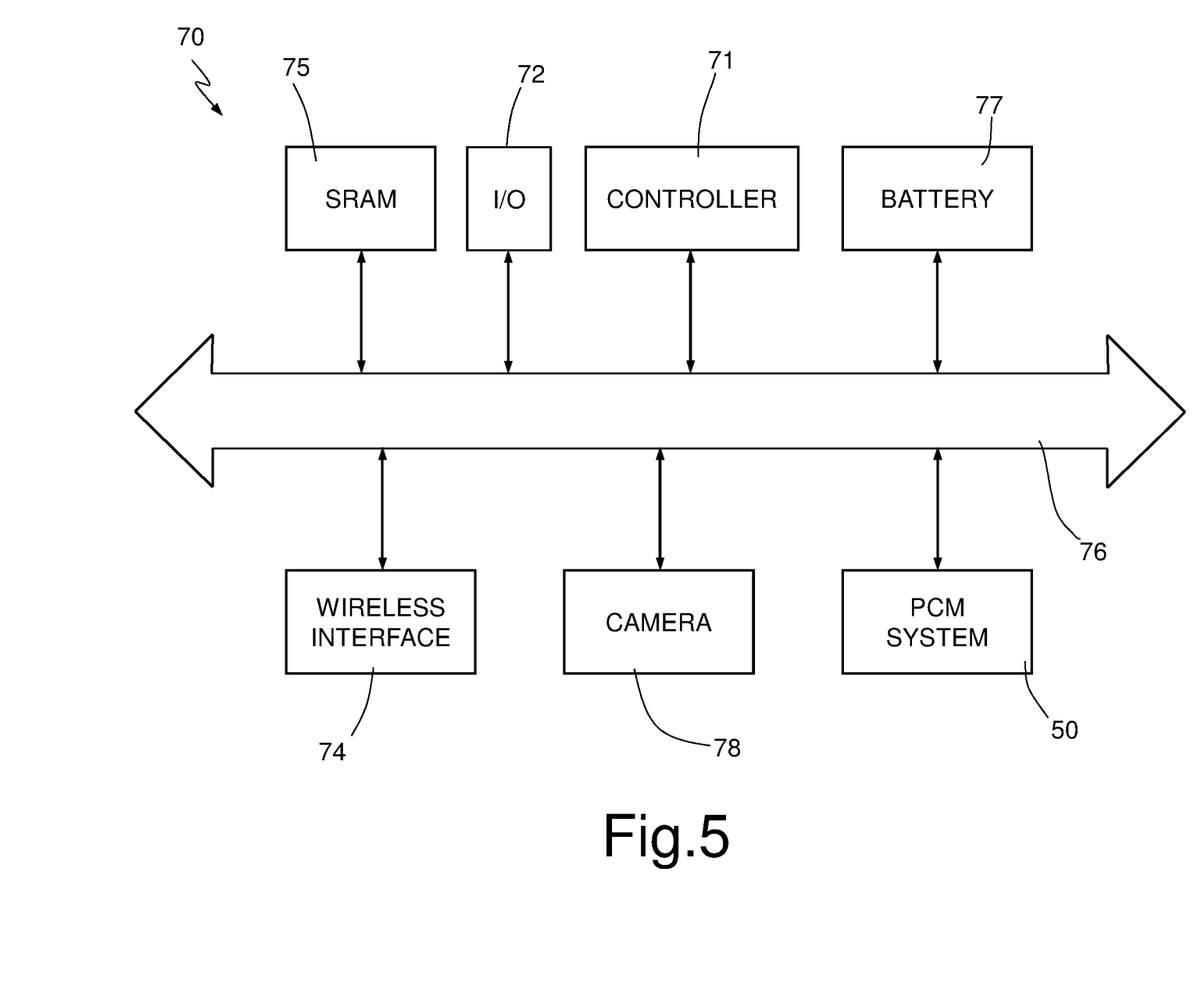
FIG. 5 is a simplified block diagram of an electronic system incorporating the PCM device of FIG. 4.

FIG. 5 illustrates a portion of an electronic system 70, which may be used in electronic devices, such as: a PDA (Personal Digital Assistant); a portable or fixed computer, possibly with wireless data-transfer capacity; a cellphone; a digital audio player; a photographic camera or video camera; a wearable electronic device; or further devices that are able to process, store, transmit and receive information.

In detail, as a non-limiting example, the electronic system 70 comprises a controller 71 (for example, provided with a microprocessor, a DSP, or a microcontroller), an input/output device 72 (for example, provided with a keypad and a display), for entering and displaying data, the memory system 50, a wireless interface 74, for example an antenna, for transmitting and receiving data through a radiofrequency wireless communication network and a RAM 75, all coupled through a bus 76. A battery 77 may be used as electric power supply source in the electronic system 70, which may further be provided with a photographic or video camera 78.

Figure 6:
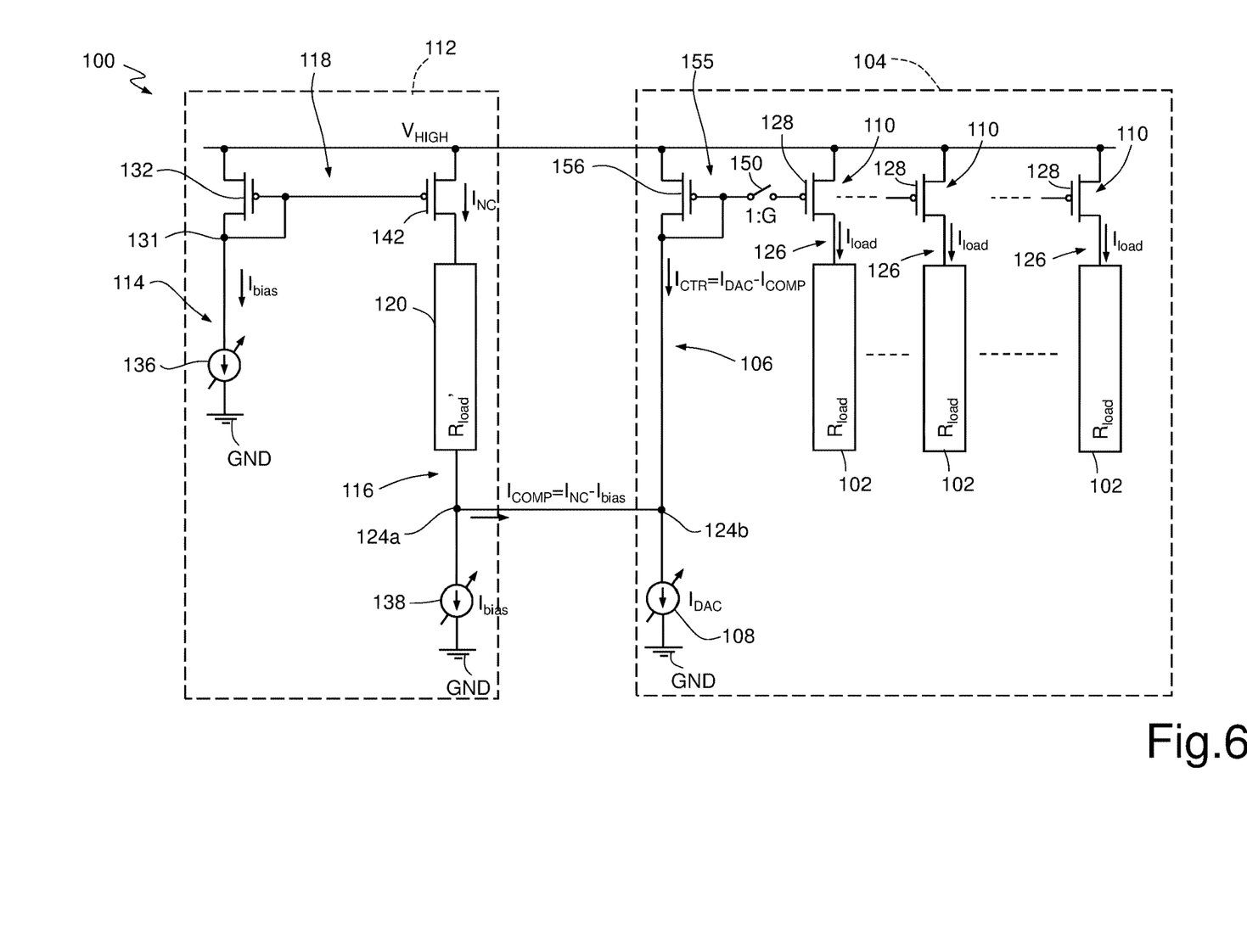
FIG. 6 is a circuit representation of a generic current-generator circuit for supplying an output current to a resistive load, according to an embodiment of the present invention.

FIG. 6 shows a current-generator circuit 100 operable to generate an output current pulse $I_{load}$ to be fed to one or more resistive loads 102 (a plurality of resistive loads is shown in FIG. 6). Elements which are common to the circuit of FIG. 3 are apparent, and therefore reference to them may be made to better understand the following description of FIG. 6.

The invention of FIG. 6 finds application as current-generation circuit for any kind of resistive memories (e.g., conductive bridge RAM—CBRAM, Oxide based RAM—OxRAM, etc.), or as current generator for resistive heaters that are employed in high temperature gas sensors, for reconfigurable integrated antennas, for dispenser cathodes, for beam control in semiconductor laser, and for still other applications, devices and systems requiring a current generator which is insensitive to the effect of the resistive load.

In FIG. 6, each resistive load 102 has a resistance $R_{load}$ which is approximately the same of the resistance $R_{load}$ of the other resistive loads 102.

The current-generator circuit 100 comprises a current generator circuit 104 and a compensation circuit 112. The current generator circuit 104 comprises a control branch 106 coupled to a control current generator 108 adapted to generate a control current pulse $I_{DAC}$, and one or more drivers 110, each of them being electrically coupled to the control branch 106 and to a respective resistive load 102. The compensation circuit 112 comprises a first compensation branch 114, configured to generate a first compensation current pulse $I_{bias}$, which is a function (e.g., a multiple or submultiple or a fraction) of the control current pulse $I_{DAC}$, and a second compensation branch 116 coupled in a current mirror configuration 118 to the first compensation branch 114 for receiving the first compensation current pulse $I_{bias}$, and including a resistive block 120 having an electrical resistance $R_{load}'$, that mimics the resistance $R_{load}$ of each of the resistive loads 102.

The second compensation branch 116 is electrically coupled to the control branch 106 to supply the control branch 106 with the compensation current pulse $I_{COMP}$ in such a way that the compensation current pulse $I_{COMP}$ is subtracted from the control current pulse $I_{DAC}$ to generate a compensated current pulse $I_{CTR}$. Each driver 110 is electrically coupled to the control branch 106 and to the respective resistive load 102 to receive from the control branch 106 the compensated current pulse $I_{CTR}$ and to generate the output current pulse $I_{load}$ as a function of the compensated current pulse $I_{CTR}$.

In greater details, according to an exemplary embodiment of the present invention, the first and second compensation branches 114,116 are connected, as said, in a current mirror configuration 118, to this end, the first compensation branch 114 includes a p-channel transistor 132 having a source node, a gate node and a drain node. The source node is coupled to a supply voltage node $V_{HIGH}$ and the gate node (also referred to herein as the mirror node) is coupled to the drain node at an intermediate node 131. The p-channel transistor 132 is accordingly a diode-connected device.

A current generator (or current source) 136 (e.g., a digital-to-analog-converter or DAC to allow digital current control) is configured to generate the current pulse $I_{bias}$ in the first biasing branch 114, and accordingly is coupled between the drain node of transistor 132 and a ground reference node GND, in series to the transistor 132.

The second compensation branch 116 includes a p-channel transistor 142 having a source node, a gate node and a drain node. The source node is coupled to the supply voltage node $V_{HIGH}$ and the gate node is connected to the gate (mirror) node of the transistor 132, thus forming the current mirror 118.

A current generator (current source) 138 is coupled to the drain node of transistor 142, in series connection, and to the ground reference node GND. The current source 138 sinks the current $I_{DAC}$ from the gate (mirror) node of transistor 132.

According to the present invention, the resistive block 120, has an electrical resistance $R_{load}'$ that is a function (i.e., "mimics") of the electrical resistance $R_{load}$ of each of the resistive loads 102. In an embodiment, $R_{load}'=R_{load}$.

The circuit 100 further includes the control branch 106, which in turn includes the current generator 108 and a control transistor 156 (here, a diode-connected P-type MOSFET). The current generator 108 is, e.g., a Digital-to-analog-Converter, DAC, and is configured to generate a current pulse $I_{DAC}$ in the control branch 106. The current generator 108 and the control transistor 156 are connected in series to one another, between the supply voltage node $V_{HIGH}$ and the ground reference node GND, in such a way that the source node of the control transistor 156 is coupled to the supply voltage node $V_{HIGH}$ and the drain node of the control transistor 156 is coupled to the current generator 108. The It is noted that current generator 138 sinks the current $I_{bias}$ from branch 114 through the mirror 118; however, due to the channel modulation effect of transistor 142 caused by the difference between the drain-to-source voltages of transistor 142 and transistor 132, a current $I_{NC}*I_{bias}$ flows through transistor 142.

A node 124a (defined in the compensation branch 116 between the resistive block 120 and the current generator 138) is electrically connected (in particular, short-circuited) to a node 124b (defined in the control branch 106 between the control transistor 156 and the current generator 108), so that the current $I_{COMP}=I_{NC}-I_{bias}$ is supplied from the compensation branch 116 to the control branch 106. Current $I_{COMP}$ may either be a positive current that is summed to the current $I_{DAC}$ generated by the current generator 108, or a negative current that is subtracted from the current $I_{DAC}$. Accordingly, a current $I_{CTR}$ flowing in the control branch 106 is given by $I_{DAC}-I_{COMP}$.

The circuit 100 further includes a plurality of output legs 126. Each output leg 126 is formed by a respective p-channel transistor 128 having a source node, a gate node and a drain node. The source node is coupled to the supply voltage node $V_{HIGH}$ and the gate node is connected to the gate node of the transistor 156 (current-mirror configuration 155) through a switch circuit 150. The switch circuit 150 is actuated to a closed state in response to an enable signal EN in order to enable the current mirroring operation in each output leg 126, outputting an output current $I_{load}$ that mirrors the control current $I_{CTR}$. A mirroring ratio 1:G between the transistor 156 and each transistor 128 may be present (e.g., 1:10), and is defined by the difference in transistor size (width/length). Each electric (resistive) load 102 is connected in series to one respective transistor 128 in the respective output leg 126.

According to the above, the output current $I_{load}$ is no more dependent (or minimally dependent) from the resistance $R_{load}$ of the loads 102.

It is noted that each of branches 114,116 and 106 of the circuit 100 may include one or more switches (transistors) as the transistors 28, 30, 38, 40, 3, 7 previously discussed with reference to FIGS. 2 and 3, according to the needs and the specific application.

From what has been described and illustrated previously, the advantages that the column decoder according to the invention affords are evident.

In particular, the mirroring ratio has been enhanced and a more accurate pulse shape is achieved.

Furthermore, the impact on area is negligible respect to PCM programming circuitry.

Furthermore, the dependency of the current with respect to the power supply is significantly reduced and there is no need of an added voltage regulator to supply the circuit.

Furthermore, the added power consumption is negligible with respect to the power consumption of the writing pulses.

Finally, it is noted that, when a ramp is generated switching DAC configurations (as needed in the program pulse to SET PCM cell), the slope obtained has a higher accuracy with respect to standard solutions.

Finally, it is clear that modifications and variations may be made to what has been described and illustrated herein, without thereby departing from the scope of the present invention, as defined in the annexed claims.

What is claimed is:

1. A current-generator circuit operable to generate an output current pulse to be fed to an output load through an output leg to which the output load is coupled, the circuit comprising:
an output-current generator circuit comprising:
a control branch to be coupled to a control current generator and adapted to provide a control current pulse; and
a driver electrically coupled between the control branch and the output leg; and
a compensation circuit, comprising:
a first compensation branch configured to generate a compensation current pulse that is a function of the control current pulse; and
a second compensation branch coupled in a current mirror configuration with the first compensation branch to receive the compensation current pulse, the second compensation branch including a resistive block having an electrical resistance that is a function of a resistance of the output load;
wherein the second compensation branch is electrically coupled to the control branch to supply the control branch with the compensation current pulse in such a way that the compensation current pulse is added/subtracted to/from the control current pulse to generate a compensated current pulse; and
wherein the driver is electrically coupled to the control branch and to the output leg to receive the compensated current pulse from the control branch and to generate the output current pulse as a function of the compensated current pulse.

2. The circuit according to claim 1, wherein the driver comprises current mirror circuitry having a mirror gain, the current mirror circuitry including a first mirror transistor connected in current mirror configuration to a second mirror transistor.

3. The circuit according to claim 2, wherein the first mirror transistor is to be coupled to the control current generator and the second mirror transistor is coupled to the output leg so that the output current pulse is a copy of the compensated current pulse amplified by the mirror gain.

4. The circuit according to claim 1, wherein the first compensation branch is coupled between a biasing line at a first voltage and a reference line at a second voltage lower than the first voltage, the first compensation branch comprising:
a first compensation current generator electrically coupled to the reference line and configured to generate the compensation current pulse;
a first cascode transistor electrically coupled between the first compensation current generator and the biasing line; and
a third mirror transistor electrically coupled between the first cascode transistor and the biasing line.

5. The circuit according to claim 4, wherein the second compensation branch is coupled between the biasing line and the reference line, the second compensation branch comprising:
a second compensation current generator, electrically coupled to the reference line and configured to generate the compensation current pulse;
a second cascode transistor electrically coupled between the second compensation current generator and the biasing line; and
a fourth mirror transistor electrically coupled between the second cascode transistor and the biasing line.

6. The circuit according to claim 5, wherein the third and the fourth mirror transistors are connected to one another according to the current mirror configuration to sink the compensation current pulse from the first compensation branch.

7. The circuit according to claim 6, wherein the driver comprises current mirror circuitry having a mirror gain, the current mirror circuitry including a first mirror transistor connected in current mirror configuration to a second mirror transistor; and
wherein the first mirror transistor is to be coupled to the control current generator and the second mirror transistor is coupled to the output leg so that the output current pulse is a copy of the compensated current pulse amplified by the mirror gain.

8. The circuit according to claim 7, wherein the control branch comprises a third cascode transistor electrically coupled in series to, and between, the first mirror transistor and the control current generator;
wherein a first node is defined between the second cascode transistor and the second compensation current generator and a second node is defined between the third cascode transistor and the control current generator; and
wherein the first and the second node are short-circuited to one another to supply the compensation current pulse from the second compensation branch to the control branch.

9. The circuit according to claim 6, wherein the resistive block is electrically coupled in series to, and between, the fourth mirror transistor and the second cascode transistor.

10. The circuit according to claim 1, wherein the output leg is coupled to a column decoder of a memory array that includes at least one bitline to which a phase-change memory cell to be programmed by the output current pulse is coupled;
wherein the column decoder includes one or more selector devices operable to address the bitline; and
wherein the electrical resistance of the resistive block is a function of a resistance of the phase-change memory cell during a programming operation of the phase-change memory cell.

11. The circuit according to claim 10, wherein the electrical resistance of the resistive block is moreover a function of an electrical resistance of the one or more selector devices, in such a way that the electrical resistance of the resistive block is given by the sum of the electrical resistances of the one or more selector devices and of the phase-change memory cell during the programming operation.

12. The circuit according to claim 10, wherein the electrical resistance of the phase-change memory cell during the programming operation is the electrical resistance of a phase-change material of the phase-change memory cell at its melting point.

13. A circuit comprising:
a biasing line at a first voltage;
a reference line at a second voltage that is lower than the first voltage;
a control current generator;
an output leg;
an output-current generator circuit comprising a control branch coupled to the control current generator and a driver electrically coupled between the control branch and the output leg; and
a compensation circuit comprising a first compensation branch coupled between the biasing line and the reference line and a second compensation branch coupled between the biasing line and the reference line and electrically coupled to the control branch, the first compensation branch and the second compensation branch being coupled in a current mirror configuration;

wherein the first compensation branch comprises a first compensation current generator electrically coupled to the reference line, a first cascode transistor electrically coupled between the first compensation current generator and the biasing line, and a third mirror transistor electrically coupled between the first cascode transistor and the biasing line; and wherein the second compensation branch comprises a resistive block having an electrical resistance that is a function of a resistance of an output load to be coupled to the output leg, a second compensation current generator electrically coupled to the reference line, a second cascode transistor electrically coupled between the second compensation current generator and the biasing line, and a fourth mirror transistor electrically coupled between the second cascode transistor and the biasing line, the third and the fourth mirror transistors being connected to one another according to the current mirror configuration.

14. The circuit according to claim 13, wherein the driver comprises current mirror circuitry having a mirror gain, the current mirror circuitry including a first mirror transistor connected in current mirror configuration to a second mirror transistor, the first mirror transistor being coupled to the control current generator and the second mirror transistor being coupled to the output leg.

15. The circuit according to claim 14, wherein the control branch comprises a third cascode transistor electrically coupled in series to, and between, the first mirror transistor and the control current generator.

16. The circuit according to claim 13, wherein the resistive block is electrically coupled in series to, and between, the fourth mirror transistor and the second cascode transistor.

17. The circuit according to claim 13, further comprising:
a memory array having with a plurality of local bitlines connected to respective phase-change memory cells; and
a column decoder coupled to the output leg and to the memory array for addressing one local bitline connected to a memory cell that has to be programmed.

18. The circuit according to claim 17, wherein the column decoder includes a plurality of selector devices coupled to the local bitlines and wherein the resistive block has an electrical resistance that is a function of a resistance of a phase-change memory cell that is being addressed by the column decoder and programmed by the output-current generator circuit.

19. The circuit according to claim 18, wherein the electrical resistance of the resistive block is moreover a function of an electrical resistance of an addressed selector device coupled to the phase-change memory cell that is being addressed.

20. A phase change memory device, comprising:
a memory array provided with a plurality of local bitlines connected to respective memory cells that store respective logic data;
a column decoder coupled to the memory array for addressing one local bitline connected to a memory cell that has to be programmed;
a current-generator circuit coupled to the memory array through the column decoder, for generating a program current pulse too write a logic data in the memory cell connected to the addressed local bitline, the current-generator circuit comprising:
an output-current generator circuit comprising:
a control branch coupled to the current-generator circuit, the control branch adapted to provide a control current pulse; and
a driver electrically coupled between the control branch and the column decoder; and
a compensation circuit, comprising:
a first compensation branch configured to generate a compensation current pulse that is a function of the control current pulse; and
a second compensation branch coupled in a current mirror configuration with the first compensation branch to receive the compensation current pulse, the second compensation branch including a resistive block having an electrical resistance that is a function of a resistance of the addressed local bitline;
wherein the second compensation branch is electrically coupled to the control branch to supply the control branch with the compensation current pulse in such a way that the compensation current pulse is added/subtracted to/from the control current pulse to generate a compensated current pulse; and
wherein the driver is electrically coupled to the control branch to receive the compensated current pulse from the control branch and to generate the program current pulse as a function of the compensated current pulse.

21. The phase change memory device according to claim 20, further comprising:
a programming circuit;
a main bitline connecting the programming circuit with the addressed local bitline; and
a selector devices coupled to the addressed local bitline and operable to electrically connect the addressed local bitline to the main bitline in order to set up an electrical path between the memory cell to be written and the main bitline.

* * * * *